United States Patent
Sakai et al.

(10) Patent No.: US 10,020,222 B2
(45) Date of Patent: Jul. 10, 2018

(54) METHOD FOR PROCESSING AN INNER WALL SURFACE OF A MICRO VACANCY

(71) Applicant: Canon, Inc., Ohta-ku, Tokyo (JP)

(72) Inventors: Takeshi Sakai, Sendai (JP); Tatsuro Yoshida, Sendai (JP); Ryosuke Hiratsuka, Sendai (JP); Syun Ishikawa, Sendai (JP)

(73) Assignee: CANON, INC., Tokyo (JP)

(*) Notice: Subject to any disclaimer, the term of this patent is extended or adjusted under 35 U.S.C. 154(b) by 0 days.

(21) Appl. No.: 14/891,020

(22) PCT Filed: May 15, 2013

(86) PCT No.: PCT/JP2013/003108
§ 371 (c)(1),
(2) Date: Nov. 13, 2015

(87) PCT Pub. No.: WO2014/184825
PCT Pub. Date: Nov. 20, 2014

(65) Prior Publication Data
US 2016/0086845 A1    Mar. 24, 2016

(51) Int. Cl.
*H01L 21/768* (2006.01)
*C11D 11/00* (2006.01)
(Continued)

(52) U.S. Cl.
CPC .......... *H01L 21/76814* (2013.01); *B05D 1/00* (2013.01); *C11D 11/0047* (2013.01);
(Continued)

(58) Field of Classification Search
CPC ......... H01L 21/76814; H01L 21/30604; H01L 21/76831; H01L 21/02063;
(Continued)

(56) References Cited

U.S. PATENT DOCUMENTS 4,390,611 A    6/1983    Ishikawa et al.
4,391,889 A    7/1983    Mabuchi et al.
(Continued)

FOREIGN PATENT DOCUMENTS

JP    62-104072    5/1987
JP    63-010531    1/1988
(Continued)

*Primary Examiner* — Daniel Luke
*Assistant Examiner* — Khatib Rahman
(74) *Attorney, Agent, or Firm* — Fitzpatrick Cella Harper and Scinto

(57) ABSTRACT

There is provided a method for processing an inner wall surface of a micro vacancy, capable of reliably etching or cleaning even if the hole provided to the substrate to be processed is narrow and deep. The substrate has a surface and a micro vacancy with an opening on the surface. An aspect ratio of the micro vacancy being at least 5, or the aspect ratio being less than 5 and a ratio of a micro vacancy volume to a surface area of the opening being at least 3. The micro vacancy is exposed to an atmosphere for forming a silicon oxide film so as to form a silicon oxide film on the inner wall surface of the micro vacancy. Subsequently a processing solution with a wettability with respect to silicon oxide is introduced into the micro vacancy so as to perform processing of the inner wall surface.

20 Claims, 9 Drawing Sheets

(51) Int. Cl.
  *H01L 21/67* (2006.01)
  *H01L 21/02* (2006.01)
  *H01L 21/306* (2006.01)
  *B05D 1/00* (2006.01)

(52) U.S. Cl.
  CPC ...... *H01L 21/02057* (2013.01); *H01L 21/306* (2013.01); *H01L 21/30604* (2013.01); *H01L 21/67017* (2013.01); *H01L 21/67051* (2013.01); *H01L 21/76831* (2013.01); *H01L 21/76898* (2013.01)

(58) Field of Classification Search
  CPC ..... H01L 2225/06541; H01L 21/76898; H01L 21/02041; H01L 21/02052; H01L 21/7624; H01L 21/02054
  See application file for complete search history.

(56) References Cited

U.S. PATENT DOCUMENTS

| | | | |
|---|---|---|---|
| 4,399,206 A | 8/1983 | Katagiri et al. | |
| 4,399,207 A | 8/1983 | Sakai et al. | |
| 4,399,208 A | 8/1983 | Takasu et al. | |
| 4,413,045 A | 11/1983 | Ishikawa et al. | |
| 4,418,133 A | 11/1983 | Katagiri et al. | |
| 4,420,548 A | 12/1983 | Sakai et al. | |
| 4,427,753 A | 1/1984 | Fujimura et al. | |
| 4,446,217 A | 5/1984 | Takasu et al. | |
| 4,454,211 A | 6/1984 | Takasu et al. | |
| 4,456,671 A | 6/1984 | Mabuchi et al. | |
| 4,471,040 A | 9/1984 | Katagiri et al. | |
| 4,487,824 A | 12/1984 | Katagiri et al. | |
| 4,495,264 A | 1/1985 | Takahashi et al. | |
| 4,500,619 A | 2/1985 | Ishikawa et al. | |
| 4,535,043 A | 8/1985 | Ishikawa et al. | |
| 4,551,404 A | 11/1985 | Hiro et al. | |
| 4,554,231 A | 11/1985 | Ishikawa et al. | |
| 4,610,943 A | 9/1986 | Takiguchi et al. | |
| 4,666,810 A | 5/1987 | Umehara et al. | |
| 4,735,882 A | 4/1988 | Yamashita et al. | |
| 4,743,523 A | 5/1988 | Yamashita et al. | |
| 4,760,003 A | 7/1988 | Matsumoto et al. | |
| 4,788,119 A | 11/1988 | Yamashita et al. | |
| 4,830,944 A | 5/1989 | Umehara et al. | |
| 4,931,371 A | 6/1990 | Matsumoto et al. | |
| 5,679,171 A * | 10/1997 | Saga | H01L 21/02052 134/2 |
| 6,245,691 B1 * | 6/2001 | Jang | C23C 16/0218 257/E21.279 |
| 6,423,146 B1 * | 7/2002 | Fukazawa | B08B 3/02 134/2 |
| 6,432,324 B1 | 8/2002 | Yoshida et al. | |
| 7,176,556 B2 * | 2/2007 | Okamoto | H01L 21/4846 257/516 |
| 8,387,458 B2 | 3/2013 | Aida et al. | |
| 8,614,053 B2 | 12/2013 | Quillen et al. | |
| 8,872,345 B2 * | 10/2014 | Hsieh | H01L 23/481 257/751 |
| 9,099,536 B2 * | 8/2015 | Nomura | H01L 21/76877 |
| 2005/0215070 A1 * | 9/2005 | Kobayashi | H01L 21/02238 438/770 |
| 2007/0261240 A1 * | 11/2007 | Sexton | B41J 2/085 29/890.1 |
| 2009/0191716 A1 | 7/2009 | Nakamori | |
| 2010/0127394 A1 * | 5/2010 | Ramiah | H01L 21/76898 257/751 |
| 2010/0133623 A1 * | 6/2010 | Inumiya | H01L 21/823857 257/369 |
| 2010/0140772 A1 * | 6/2010 | Lin | H01L 21/486 257/686 |
| 2010/0144127 A1 * | 6/2010 | Nakatsuru | H01L 21/02532 438/481 |
| 2010/0244201 A1 * | 9/2010 | Kitada | H01L 21/6835 257/621 |
| 2010/0330777 A1 * | 12/2010 | Hanaoka | H01L 21/02032 438/458 |
| 2011/0241196 A1 * | 10/2011 | Yoon | H01L 23/04 257/692 |
| 2011/0284386 A1 * | 11/2011 | Willey | C25D 3/38 205/96 |
| 2012/0103521 A1 | 5/2012 | Zeng | |
| 2012/0168206 A1 | 7/2012 | Sekine et al. | |
| 2012/0174945 A1 | 7/2012 | Saio et al. | |
| 2013/0037919 A1 * | 2/2013 | Sapra | H01L 21/02238 257/622 |
| 2013/0334699 A1 * | 12/2013 | Kuo | H01L 21/76898 257/774 |

FOREIGN PATENT DOCUMENTS

| | | |
|---|---|---|
| JP | 2-12598 | 1/1990 |
| JP | H10-172942 | 6/1998 |
| JP | 11-87290 | 3/1999 |
| JP | 2002-289575 | 10/2002 |
| JP | 2003-077899 | 3/2003 |
| JP | 2006-278955 | 10/2006 |
| JP | 2009-182136 | 8/2009 |
| JP | 2010-019716 | 1/2010 |
| JP | 2012-156369 | 8/2012 |
| JP | 2012-204424 | 10/2012 |
| TW | 201216351 | 4/2012 |
| TW | 201219562 | 5/2012 |
| WO | 2012/096133 | 7/2012 |

* cited by examiner

METHOD FOR PROCESSING AN INNER WALL SURFACE OF A MICRO VACANCY

This application is national phase of PCT Application No. PCT/JP2013/003108 filed May 15, 2013.

TECHNICAL FIELD

The present invention relates to a method for processing an inner wall surface of a micro vacancy.

BACKGROUND ART

The semiconductor field has heretofore made significant advances in high integration with the miniaturization of the transistor, a basic electronic active element (basic electronic element). Stagnation of exposure technology, a basic technology thereof, however, has prompted discussions on theories of limitation to high integration based on miniaturization. Further, miniaturization of the basic electronic element presents potential problems in temperature rise and electronic leakage in devices obtained from large-scale integration (LSI) device development. Recently, technological development of high integration that does not depend on miniaturization has also started. One such technology is LSI three-dimensional integration (3DI). One technology required to achieve this technology is through silicon via (TSV). A 3D integrated LSI device that uses this technology, unlike a package-level 3D integrated device that uses wire bonding technology, is expected to show dramatic improvement in electrical interconnectivity between each integrated device, and holds much promise as a highly-integrated device of the next generation.

A through-hole required in TSV is a narrow, deep hole having a depth from tens of microns to several hundred microns, and an aspect ratio of at least 10 (high aspect ratio hole). To form such a hole, adoption of a dry etching method, which has recently been adopted in the formation of half-micron to quarter-micron minute circuit patterns, and an oxygen plasma asking method for resist removal have been proposed. However, in such a dry etching method, deposited polymers caused by dry etching gas, resist, and the like occur on the hole peripheral portion to be formed, remain in the hole interior and on the peripheral portion, and cause high resistance, electrical short-circuits, and a decrease in yield. Further, wet cleaning is required to remove the remaining deposited polymers and clean the hole interior. As a result, the expectations of the wet etching or cleaning process performed to date have heightened for TSV as well.

Nevertheless, the studies and experiments of the inventors have shown conclusions such as the following, making it clear that the wet etching or cleaning of prior art are inadequate. That is, when a conventional processing solution is used in a case where a bottom portion of a high aspect ratio hole is etched and the hole interior is cleaned, the processing solution (etching solution, cleaning solution, and the like) may not enter the hole because the hole is narrow and deep. As a result, a situation in which etching or cleaning cannot be performed as expected occurs. Possible solutions include a conventionally implemented policy of resolving future problems by mixing a surfactant in the processing solution and improving the wettability of the hole inner wall.

Nevertheless, while there are proposals for improving wettability while ensuring sufficient fulfillment of the function of the processing solution to achieve such an objective, preparations of an appropriate processing solution for etching as well as cleaning have not been realized. Furthermore, when the processing solution is supplied from the treated body surface to the hole, a phenomenon in which air bubbles of atmospheric gas are formed inside the hole, inhibiting entry of the processing solution in the hole, may also occur. This phenomenon has been remarkably observed in cylindrical holes.

There has been proposed a technique in which depressurization and pressurization are repeatedly performed when polycrystalline silicon for a solar battery having a plurality of complex minute holes is cleaned using ultrasonic vibration (refer to Patent Document 1). Nevertheless, because the technique disclosed in Patent Document 1 uses ultrasonic vibration, the height of the wall in a hole pattern having a high aspect ratio such as that of TSV, which serves as a target in this case, is extremely high with respect to the wall thickness of the wall surface member in which the hole is formed, resulting in the problem of the wall surface member collapsing (pattern collapse) due to the ultrasonic vibration. This problem becomes increasingly significant as the aspect ratio of the hole increases, and as the hole pattern becomes more and more minute.

CITATION LIST

Patent Literature

PTL 1 Japanese Patent Laid-Open No. 2012-598

SUMMARY OF INVENTION

Technical Problem

The present invention is the result of vigorous research taking the above into consideration, and it is therefore an object of the present invention to provide a method for processing a hole inner wall surface that allows processing solution to quickly enter and fill a hole, even if the hole provided to the substrate to be processed is narrow and deep, thereby making it possible to reliably perform etching or cleaning without hole pattern collapse. Since the present invention targets an ultra-fine and high aspect ratio hole. Thereafter, the term "micro vacancy" is also used in place of "hole", in order to reflect the technological implications.

Solution to Problem

One aspect of the present invention is a method for processing an inner wall surface of a micro vacancy, includes a step of arranging a substrate in a processing space, the substrate comprising a silicon oxide layer and a silicon layer formed thereon, the silicon layer comprising a surface on which a processing solution is to be applied and a micro vacancy with an opening on the surface, the micro vacancy passing through the silicon layer and comprising an exposed surface of the silicon oxide layer at a bottom portion thereof, an aspect ratio (l/r) of the micro vacancy being at least 5, or the aspect ratio being less than 5 and a ratio (V/S) of a micro vacancy volume (V) to a surface area of the opening (S) being at least 3, a step of exposing the micro vacancy to an atmosphere for forming a silicon oxide film through the opening in the processing space so as to form a silicon oxide film on the inner wall surface of the micro vacancy, and a step of subsequently introducing a processing solution with h a wettability with respect to silicon oxide into a space of the micro vacancy with the silicon oxide film formed on the inner wall surface so as to perform processing of the inner wall surface.

Advantageous Effects of Invention

According to the present invention, the processing solution quickly enters and fills the hole (micro vacancy), even if the hole is narrow and deep, thereby making it possible to reliably perform processing of an inner wall surface such as etching or cleaning.

DESCRIPTION OF EMBODIMENTS

Figure 1:
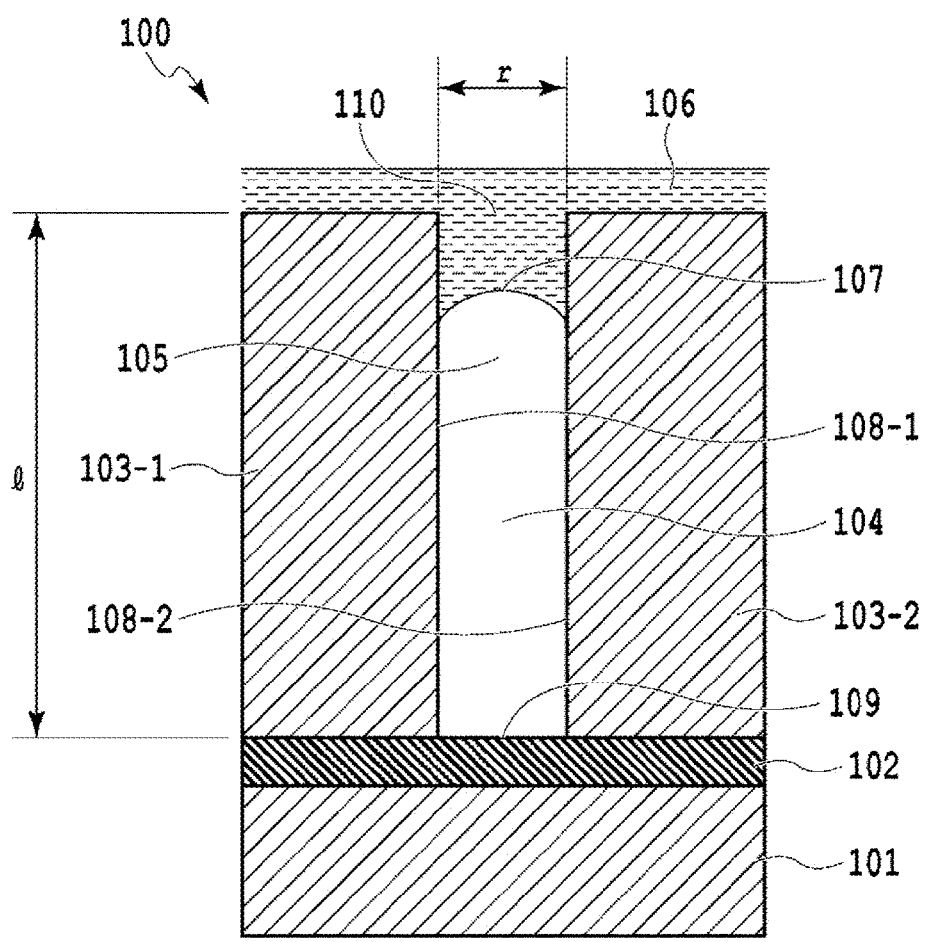
FIG. 1 is a schematic explanatory view for explaining a situation in which air bubbles exist in a narrow and deep hole (micro vacancy) provided to a silicon-on-insulator (SOI) substrate, and a processing solution does not penetrate to a hole bottom portion.

FIG. 1 is a schematic explanatory view for explaining a situation in which air bubbles exist in a narrow and deep hole provided to a silicon-on-insulator (SOI) substrate, and a processing solution does not penetrate to a hole bottom portion.

In FIG. 1, a symbol 100 denotes an SOI substrate, 101 denotes a silicon (Si) semiconductor substrate, 102 denotes a silicon oxide ($SiO_2$) layer, 103 denotes a Si layer (103-1, 103-2), 104 denotes a hole, 105 denotes an air bubble, 106 denotes a processing solution, 107 denotes a gas-liquid interface, 108 denotes an inside wall surface (108-1, 108-2), 109 denotes an inner bottom wall surface, and 110 denotes an opening.

Under a normal pressure atmosphere, when a processing solution is supplied to a surface of the SOI substrate 100, a situation in which the hole 104 (micro vacancy) is not adequately filled with the processing solution may occur, even if a wettability with respect to an inside wall surface of the Si layer 103 is favorable (one such example is schematically illustrated in FIG. 1). When the circumstances of the hole 104 not being filled with the processing solution are carefully observed, the air bubble 105 exists inside the hole 104. When the SOI substrate 100 is kept in a state of rest, the air bubble 105 stays inside the hole 104, blocked by the processing solution 106. When ultrasonic vibration is applied to the SOI substrate 100 under circumstances in which the air bubble 105 exists, gas-liquid exchange occurs inside the hole 104 and the hole 104 is quickly filled with the processing solution. Or, when processing solution is supplied onto the surface of the SOI substrate 100 while ultrasonic vibration is applied to the SOI substrate, air bubble formation tends to be relatively obstructed, making formation of the air bubble 105 less likely. However, when the ultrasonic vibration becomes excessive or too severe, a pattern, for example, to be formed or that has been formed, collapses, and thus adoption of ultrasonic vibration in the present invention is not preferred. Even if ultrasonic vibration were to be adopted, it is preferably performed gently in a range in which pattern collapse does not occur.

Given an opening diameter "r" of the hole 104 and a depth "l" from an opening position of the hole 104 to the inner bottom wall surface 109, a so-called aspect ratio is expressed by "l/r." The conditions under which the air bubble 105 inside the hole 104 is formed include many parameters, such as a surface tension, a viscosity, and a composition of the processing solution, a surface smoothness of the inside wall surface 108, a wettability of the used processing solution, sizes of "r" and "l," and the aspect ratio, making it difficult to theorize.

The inventors first formed a variety of holes in an SOI substrate of structural materials such as illustrated in FIG. 1, without limiting an inner structure of the hole 104 to a cylinder, and used ultrapure water as the processing solution to verify air bubble formation trends. The inner structure of the hole 104 was created in a variety of sizes, including a pouch shape (with a lower portion of the opening widened into a bag shape or tapered shape), a rectangular shape (with the opening in a four-cornered shape, such as a square, rectangle, or diamond), a triangular shape, a hexagonal shape, an elliptical shape, an ultra-elliptical shape, a star shape, and the like, without limitation to the cylindrical shape. As a result, given a surface area "S" of the opening 110 and an internal volume "V" of the hole 104, a susceptibility of air bubble formation was found to rapidly increase starting from near a "V/S" value of 3, regardless of shape. Further, among the various shapes, a comparison of cases where the inside wall surface of the hole 104 has a curve (such as a cylinder or an ellipse) versus a corner (such as a rectangle) showed that a curved surface is more susceptible to air bubble formation. While the cause remains in the realm of speculation, when there is a corner on the inner wall, the corner is less likely to be taken up by air bubbles because the air bubbles have a strong tendency to form in spheres, and it is thought that the solution reaches the inner bottom wall surface 109 through the corners, thereby allowing the gas-liquid exchange to more readily occur and the hole space to be filled with the solution.

Then, in place of the ultrapure water, the inventors used hydrofluoric acid (HF) and buffered hydrofluoric acid (BHF) and performed etching of the $SiO_2$ layer 102 constituting the inner bottom wall surface 109. Results showed that the hydrofluoric acid did not relatively cause air bubble formation to an excessive degree, even near a "V/S" value of "3" (about 15 air bubbles formed in 300 holes having a "V/S" value of "3"), while the buffered hydrofluoric acid caused air bubble formation at percentage of 80% (240 air bubbles), resulting in inadequate etching. As a result of intensive studies, the inventors found that an inner wall surface of a high aspect ratio hole can be efficiently processed by forming SiO2 film made of the same material as the SiO2 layer 102 constituting the hole bottom surface to be etched or cleaned on the hole-side surface so as to form the inner wall surface of the hole with the same material, and by using chemical solution excellent in wettability with respect to SiO2 as processing solution used for etching or cleaning.

In the present invention, an inner space of the hole is hereinafter also referred to as a "micro vacancy." In the present invention, the value of "r" for a structure in which the micro vacancy is not a cylinder ("non-cylinder") is found by regarding the micro vacancy at that time as a cylinder, from "S" of the non-cylinder. "l" in such a case is a depth (maximum depth) from an opening position to a deepest inner bottom wall surface position of the micro vacancy. The effect of depressurization in the present invention is remarkable when the aspect ratio (l/r) is at least 5 or when the aspect ratio is less than 5 and V/S (V: volume of micro vacancy, S: surface area of opening) is at least 3. In particular, an even more remarkable effect can be achieved when the processing solution is buffered hydrofluoric acid and the treated body is an SOI substrate.

In the present invention, when the "l/r" value is at least 5, the depressurization effect is remarkably achieved without dependency on the "V/S" value. When the "l/r" value is less than 5, the depressurization effect depends on the "V/S" value and is substantially not achieved when "V/S"<3, increasing the percentage of holes in which air bubbles remain. In the present invention, when the "l/r" value is less than 5, the "V/S" value is more preferably at least 3.5.

Figure 2:
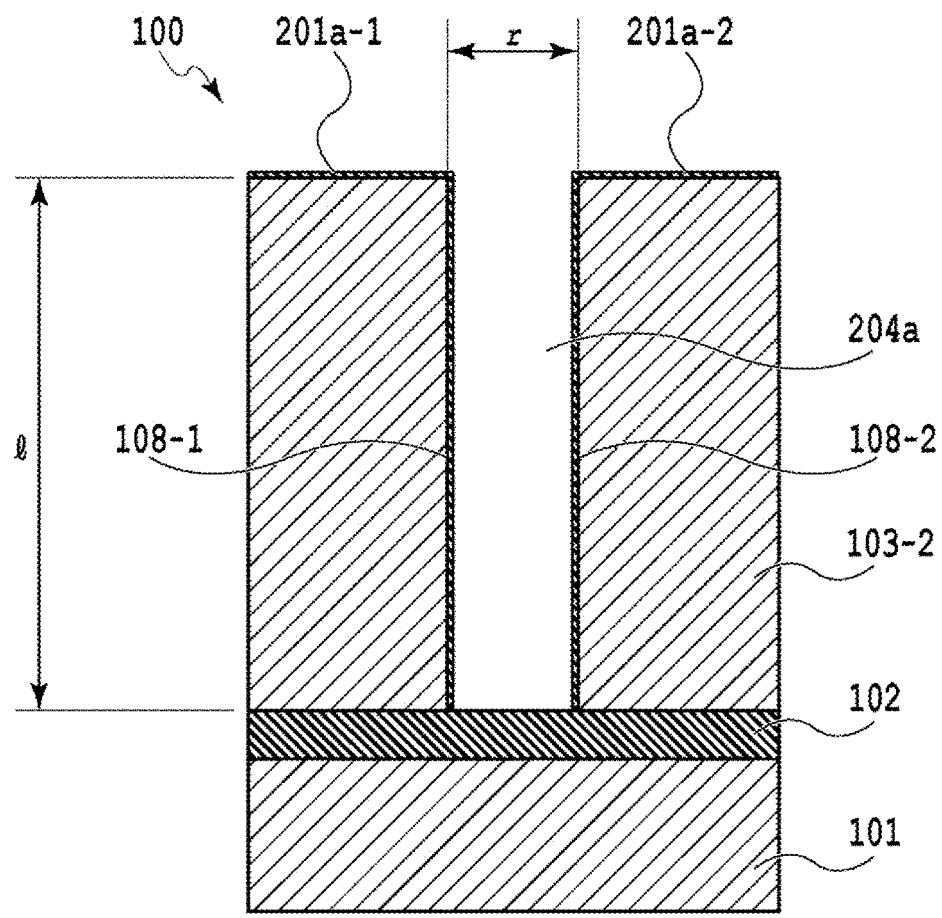
FIG. 2 is a schematically explanatory diagram of a process for forming SiO2 film on the inner wall surface of the micro vacancy prior to introduce processing solution into the micro vacancy so as to process the interior thereof.

FIG. 2 is a schematic explanatory view for explaining a case of providing the SiO2 film on the inner wall surface of the micro vacancy prior to introduce the processing solution into the micro vacancy so as to process the interior of the micro vacancy. In FIG. 2, elements being similar to FIG. 1 are denoted by the same reference numerals in FIG. 1. A prescribed hole is provided to Si layer 103 of the SOI substrate 100 in advance. Then, chemicals containing ozone for forming the SiO2 film into the prescribed hole in a liquid, atomized or gaseous state and the interior space of the hole is exposed to an atmosphere containing ozone so that SiO2 film 201a (201a-1, 201a-2) is formed on the inner wall surface 108 (108-1 and 108-2) and the Si layer 103 surface. As a result, a hole (micro vacancy) 204a is completed. For the formation of the atmosphere containing ozone, it is preferred to use ozone water. In particular, it is preferred to use ozone water having 5 to 8 ppm concentration of ozone, made by dissolving ozone directly into ultrapure water. Alternatively, gaseous ozone can be introduced directly into the hole. In some cases, a desired concentration of hydrochloric acid, nitric acid, sulfuric acid and mixtures thereof capable of oxidizing silicon (Si) can be used, instead of forming the atmosphere for forming the SiO2 film by using these chemicals containing ozone. Furthermore, one or more selected from hydrogen peroxide, phosphoric acid, acetic acid, propionic acid, oxalic acid and succinic acid can be mixed to these acids. In processing of a pattern including such as a resist pattern, it is desirable to use BHF which does not attack the resist pattern. BHF is an aqueous solution of a 40% ammonium fluoride (NH4F) and 50% hydrofluoric acid mixed at any rate. As SiO2 film 201a is later removed, the thickness thereof is desirably about several nanometers. As the thickness of the SiO2 film 201a is extremely thin, a volume of the micro vacancy 204a is almost same as that of the original hole is almost the same. In the present invention, the processing solution used for cleaning the interior of the micro vacancy 204a or etching the SiO2 layer 102 at the bottom surface can be selected from materials with liquid composition having a high affinity to SiO2. As such processing solution, etching solutions such as hydrogen fluoride (HF) acid and buffered hydrofluoric acid (BHF), and cleaning solutions such as H2SO4/H2O2 (SPM), NH4OH/H2O2/H2O (APM), HCl/H2O2/H2O (HPM), HF/H2O (DHF) can be included. An etchant upon forming the micro vacancy 204a into the Si layer 103 by etching can be appropriately selected from something desired. As alkaline etching solutions, for example, the following etchant can be included, which is obtained by mixing (1) one or more alkali compound(s) selected from tetra methyl ammonium hydroxide, potassium hydroxide and sodium hydroxide, and (2) at least one of alkali salts selected from tetra methyl ammonium hydrochloride, tetra methyl ammonium nitrate, tetra methyl ammonium sulfate, tetra methyl ammonium acetate, tetra methyl ammonium propionate, tetra methyl ammonium oxalate, tetra methyl ammonium succinate, potassium chloride, sodium chloride, potassium acetate, sodium acetate, and (3) Hydroxylamine. As acid etching solutions, an etchant can be included, which is obtained by mixing (1) one or more acids selected from hydrochloric, sulfuric, nitric, phosphoric, acetic, propionic acid, oxalic acid and succinic acid, and (2) one or more selected from silicon hydrofluoric acid (H2SiF6), fluoroboric acid (HBF4), sodium fluoride (NaF), potassium fluoride (KF), calcium fluoride (CaF), ammonium fluoride (NH4F), acidic ammonium fluoride (NH4HF2). In addition, hydrofluoric acid also can be used.

Figure 3:
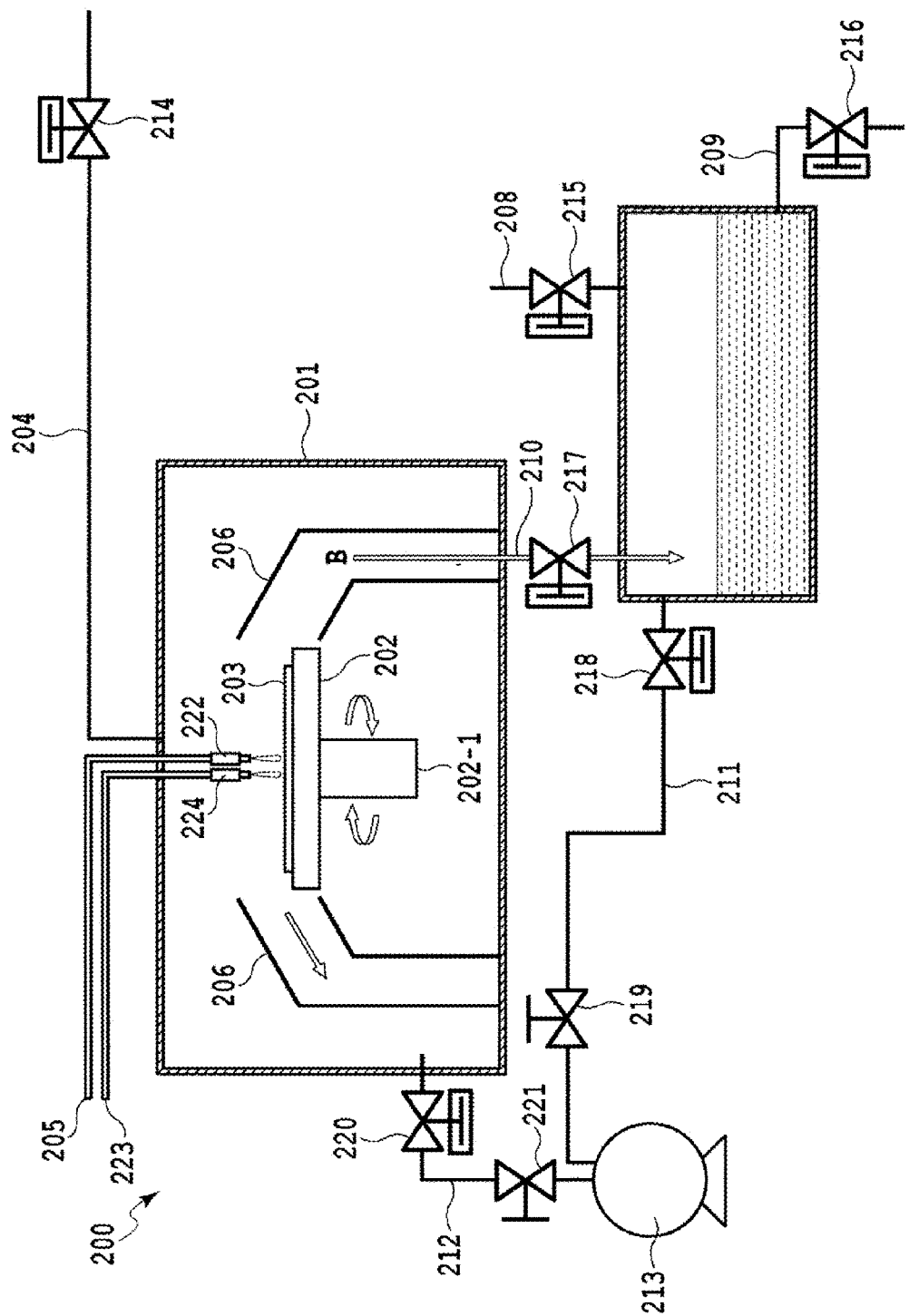
FIG. 3 is a schematic configuration diagram for explaining an example of a favorable manufacturing system for embodying the present invention.
Figure 4:
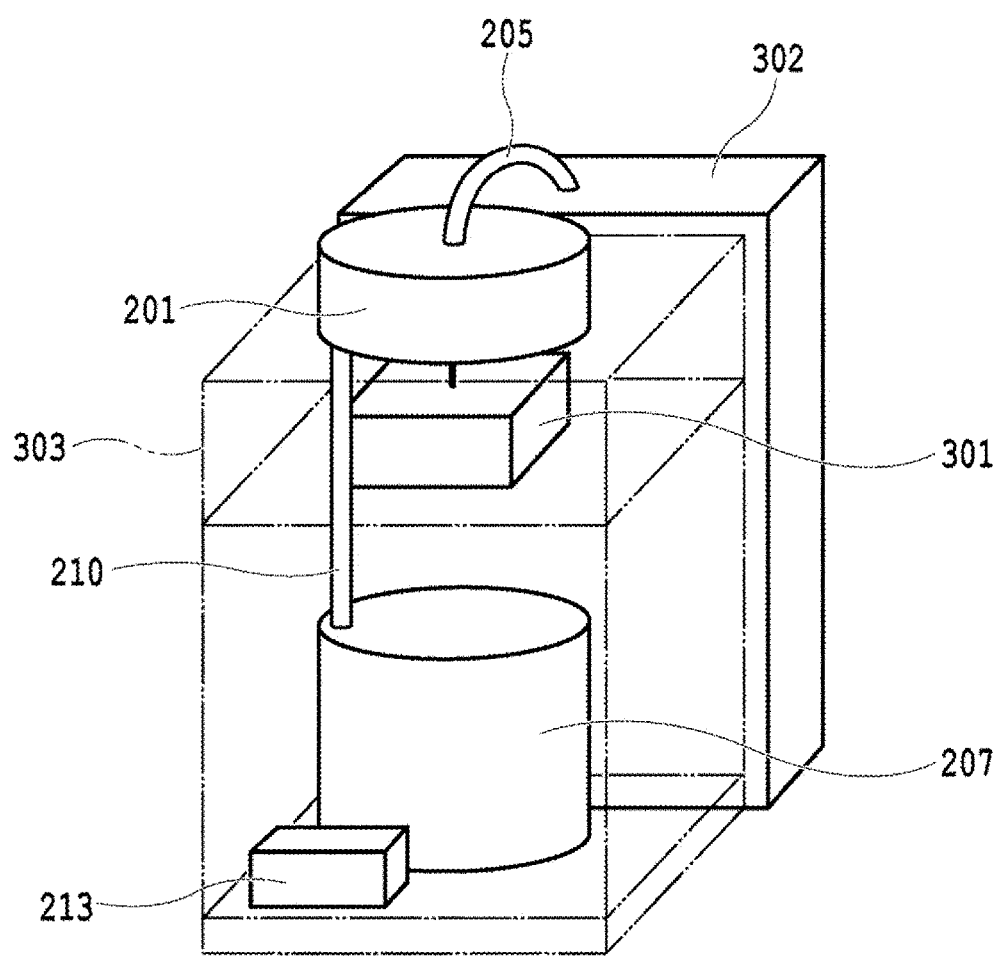
FIG. 4 is a schematic configuration diagram of a portion of a manufacturing line illustrated in FIG. 3.

FIG. 3 is a schematic configuration diagram for explaining an example of a favorable manufacturing system for realizing the present invention. FIG. 4 is a schematic configuration diagram of a portion of a manufacturing line illustrated in FIG. 3. In the manufacturing system shown in FIGS. 3 and 4, a processing can be performed not only under atmospheric (normal) pressure but also under reduced pressure as necessary. In FIGS. 3 and 4, 200 denotes a processing system, 201 denotes a depressurizable process chamber, 202 denotes a treated body placement table, 202-1 denotes a rotating shaft for the treated body placement table, 203 denotes a treated body, 204 denotes an atmospheric gas supply line, 205 denotes a processing (chemical) solution supply line, 206 denotes a recovery hood, 207 denotes the depressurization waste solution tank, 208 denotes an air or N₂ supply line, 209 denotes a drainage line, 210 denotes a recovery line, 211 and 212 denote exhaust lines, 213 denotes an exhaust pump, 214 to 221 denote valves, 222 denotes a variable supply rate nozzle for the processing solution, 301 denotes a spinner, 302 denotes the cartridge, and 303 denotes an aluminum frame.

The processing system 200 comprises the depressurizable process chamber 201 and the depressurizable waste solution tank 207, each having an interior configured to be depressurized to a predetermined value by the exhaust pump 213. Atmospheric gas such as N₂ is supplied from the outside via the atmospheric gas supply line 204, and processing (chemical) solution is supplied via the processing solution supply line 205 to the process chamber 201, each at predetermined timings and predetermined rates. An opening/closing value 214 that constitutes a flow rate adjustment function is provided midway on the atmospheric gas supply line 204. A variable supply nozzle 224 is connected to a distal end of an ozone processing solution supply line 223 so that processing solution can be supplied into the processing chamber 201 at an adjusted flow rate to a predetermined value. The treated body placement table 202 is arranged so as to be fixed to the rotating shaft 202-1 for the treated body placement table, inside the depressurization process chamber 201. The treated body 203 is arranged on the treated body placement table 202. The atmospheric gas supplied inside the depressurization process chamber 201 via the atmospheric gas supply line 204 passes through the recovery hood 206, as illustrated by an arrow A, and the processing solution supplied via the processing solution supply line 205, as illustrated by an arrow B, and each is recovered inside the depressurization waste solution tank 207 from the recovery line 210 through the recovery hood 206. The opening/closing valve 217 is provided midway on the recovery line 210.

The supply line 208 and the exhaust line 211 are coupled to the depressurizable waste solution tank 207. The supply line 208 is a supply line for air or $N_2$. The waste solution 223 inside the depressurization waste solution tank 207 is discharged outside the depressurization waste solution tank 207 via the drainage line 209. The air or $N_2$ can be supplied from the supply line 208 and returned to one atmosphere pressure as necessary inside the depressurization waste solution tank 207. The opening/closing valve 215 is provided midway on the supply line 208. Further, the opening/closing valve 216 is provided midway on the drainage line 209. The depressurization process chamber 201 is depressurized via the exhaust line 212, and the waste solution tank 207 is depressurized via the exhaust line 211, each by the pump 213. The valves 218, 219 are arranged midway on the exhaust line 211, and the valves 220, 221 are arranged midway on the exhaust line 212. The valves 219, 221 are opening/closing valves that constitute a flow rate variable mechanism. The exhaust pump 213 is a pump resistant to moisture, and a diaphragm type chemical dry vacuum pump, specifically DTC-120 (made by ULVAC), for example, is preferably adopted.

Figure 5:
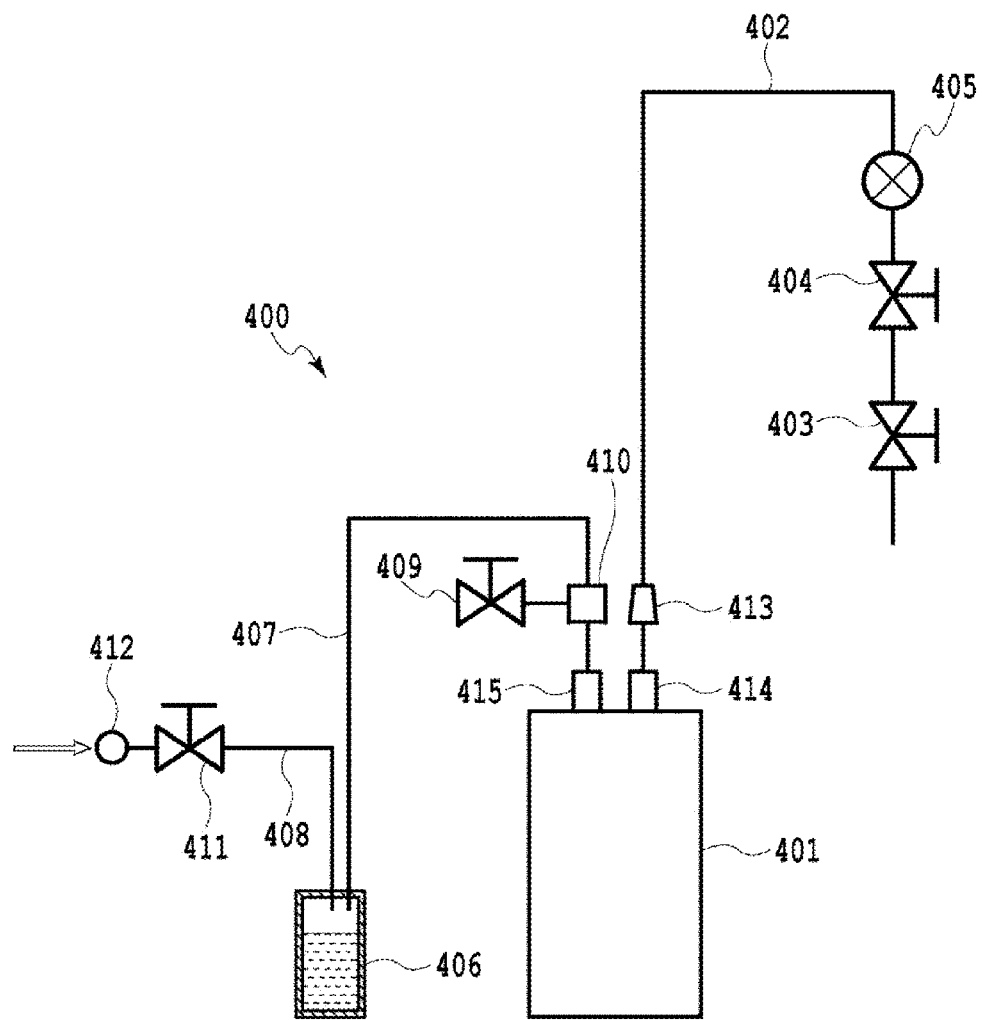
FIG. 5 is a schematic explanatory view for explaining a favorable configuration of a processing (chemical) solution supply system provided in an interior of a cartridge 302.

The process chamber 201 and the waste solution tank 207 are attached to the frame 303 made of aluminum, for example, as illustrated in FIG. 5. The spinner 301 provided for rotating the rotating shaft 202-1 is also attached to the frame 303. The cartridge 302 that stores processing solution is connected to an upstream end of the processing (chemical) solution supply line 205.

FIG. 5 is a schematic explanatory view for explaining a favorable configuration of a processing (chemical) solution supply system provided in an interior of the cartridge 302. In FIG. 4, 400 denotes a nitrogen force-feed type processing (chemical) solution supply system, 401 denotes a canister, 402 denotes a processing solution supply line, 403 and 411 denote stop valves, 404 denotes a flow rate adjustment valve, 405 denotes a flow meter, 406 denotes a mist trap, 407 and 408 denote a nitrogen gas supply line, 409 denotes a vent (exhaust) valve, 410 denotes a flow-dividing joint, 412 denotes a regulator, 413 denotes a joint, and 414 and 415 denote quick connectors.

In the nitrogen force-feed type processing (chemical) solution supply system 400, the processing solution supply line 402 provided with a ⅜-inch line on an upstream side and a ¼-inch line on a downstream side via the joint 413, and the ¼-inch nitrogen gas supply line 407 are connected to the canister 401 via the quick connector 414 and the quick connector 415, respectively. The stop valve 403, the flow rate adjustment valve 404, and the flow meter 405 are provided midway on the processing solution supply line 402. Then, a downstream section on the stop valve 403 side of the processing solution supply line 402 is connected to the processing solution supply line 205. The vent (exhaust) valve 409 and the flow-dividing joint 410 are provided midway on the nitrogen gas supply line 407. The vent (exhaust) valve 409 is for venting the nitrogen gas inside the canister 401 and inside the nitrogen gas supply line 407 to the outside. The downstream side of the nitrogen gas supply line 407 is inserted inside the mist trap 406. The nitrogen gas is introduced inside the mist trap 406 through the regulator 412, the stop valve 411, and the nitrogen gas supply line 408. The mist trap 406 is provided for preventing back flow of the processing solution to the upstream side.

Figure 6:
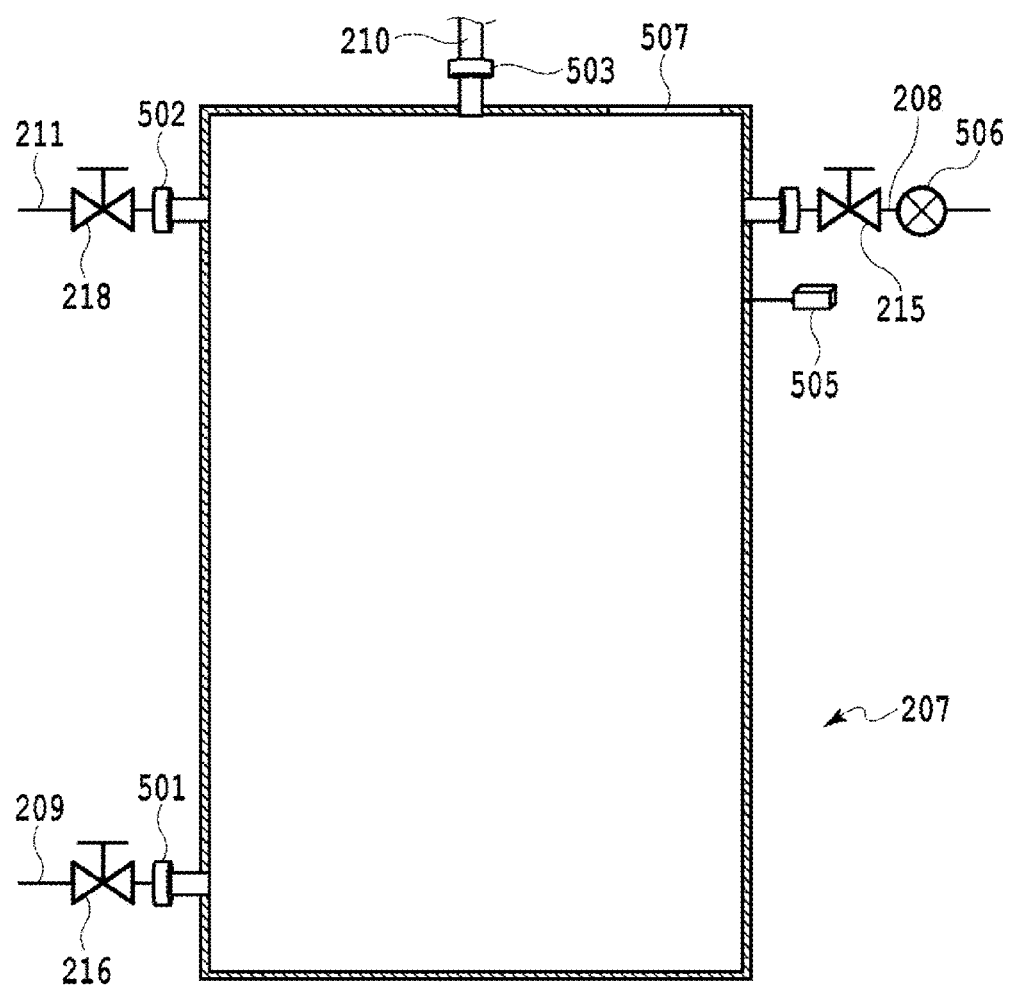
FIG. 6 is a schematic configuration diagram of a depressurization waste solution tank 207.

FIG. 6 is a schematic configuration diagram of the depressurization waste solution tank 207. In FIG. 6, 501 denotes a drain flange, 502 denotes a depressurization flange, 503 denotes a waste solution introduction flange, 504 denotes a gas introduction flange, 505 denotes a vacuum gauge, 506 denotes a flow meter, and 507 denotes a solution level observation window.

The drainage line 209, the exhaust line 211, the recovery line 210, and the supply line 208 are connected to the waste solution tank 207 via the drain flange 501, the depressurization flange 502, the waste solution introduction flange 503, and the flange 504, respectively. The vacuum gauge 505 measures the pressure inside the waste solution tank 207. The solution level observation window 507 comprising a waste solution transparent member is provided to an upper portion of the waste solution tank 207 for observing the level of the waste solution inside the waste solution tank 207.

Figure 7:
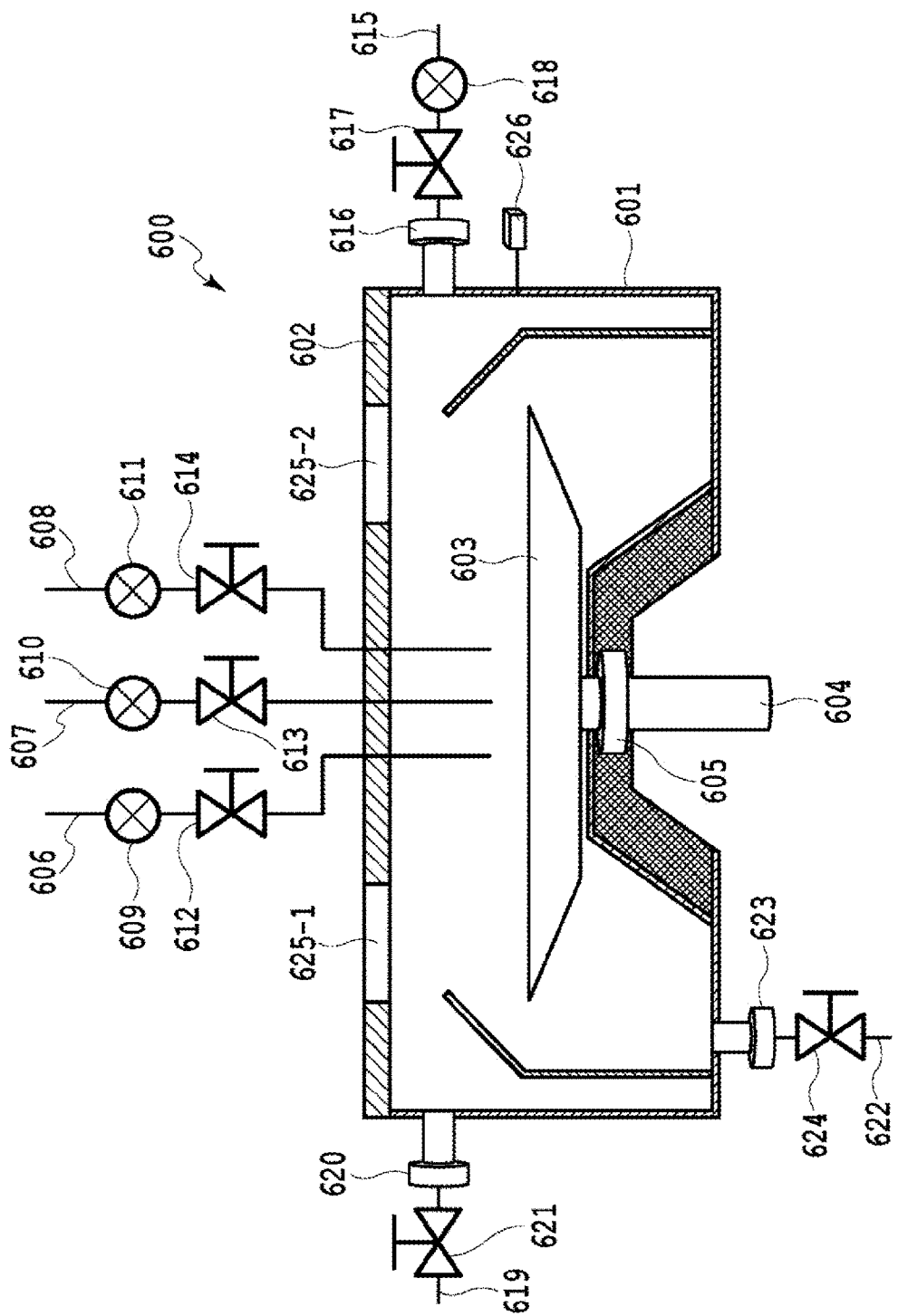
FIG. 7 is a schematic configuration diagram for explaining another favorable process chamber.
Figure 8:
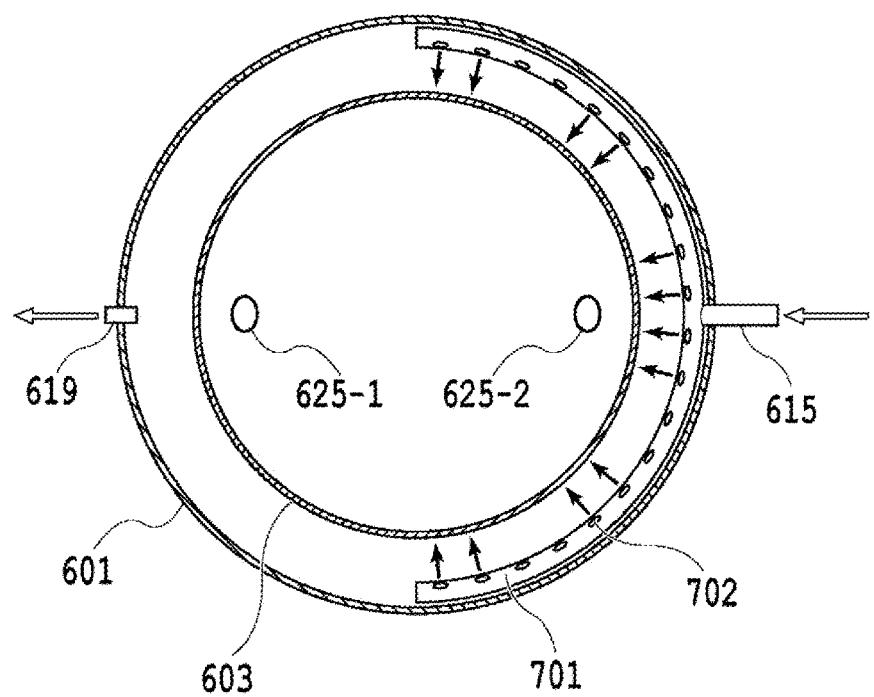
FIG. 8 is a schematic top view for explaining an arrangement of a jet nozzle of nitrogen ($N_2$) gas provided on an inner wall surface of a process chamber 501 in FIG. 7, and a jetting direction.

FIG. 7 is a schematic configuration diagram for explaining another favorable process chamber. In FIG. 6, 600 denotes a depressurization process chamber, 601 denotes a chamber construct, 602 denotes an upper lid, 603 denotes a treated body placement stage, 604 denotes a rotating shaft, 605 denotes a magnetic fluid seal, 606 denotes a special processing (chemical) solution supply line, 607 denotes an ozonized water supply line, 608 denotes an ultrapure water supply line, 609, 610, 611, and 618 denote flow meters, 612, 613, 614, 617, 621, and 624 denote valves, 615 denotes a gas introduction line, 619 denotes a gas discharge line, 616, 620, and 623 denote flanges, 622 denotes a waste solution line, 625 denotes an observation window (625-1, 625-2), and 626 denotes a vacuum gauge.

Unlike the process chamber 201 illustrated in FIG. 3, the process chamber 600 illustrated in FIG. 7 further comprises the three supply lines of the special processing (chemical) solution supply line 606, the ozonized water supply line 607, and the ultrapure water supply line 608. Otherwise, excluding one other difference, the structure is basically no different from that of the process chamber 201. The other difference is that the gas introduction line 615 and the gas discharge line 619 are attached to the process chamber 600. The atmospheric gas inside the depressurization process chamber 600 is introduced through the gas introduction line 615. The gas introduction line 615 is attached to the process chamber 600 by the flange 616. The opening/closing valve 617 and the flow meter 618 are provided midway on the gas introduction line 615. The gas discharge line 619 is attached to the process chamber 600 by the flange 620. The opening/closing valve 621 is provided midway on the gas discharge line 619. The downstream side of the gas discharge line 619 is connected to a pump (not illustrated) similar to the exhaust pump 213. The process chamber 600 is configured by the chamber construct 601 and the upper lid 602 so that the interior is kept in a depressurized state. The two observation windows 625-1 and 625-2 for observing the interior of the chamber 600 are provided on the upper lid 602. The treated body placement stage 603 on which a treated body is arranged is provided in the interior of the process chamber 600. The rotating shaft 604 for rotating the stage 603 is fixed to the stage 603 in a removable state. The rotating shaft 604 is sealed by the magnetic fluid seal 605 and joined to the rotating shaft of the spinner arranged on the outside of the process chamber 600. The flow meter 609 and the valve 612 are provided midway on the special processing (chemical) solution supply line 606. The flow meter 610 and the valve 613 are provided midway on the ozonized water supply line 607. The flow meter 611 and the valve 614 are provided midway on the ultrapure water supply line 608. The waste solution line 622 is attached to the process chamber 600 by the flange 623 on the bottom portion of the process chamber 600. The opening/closing valve 624 is provided midway on the waste solution line 622. The vacuum gauge 626 for measuring the pressure inside the process chamber 600 is attached to a side surface of the process chamber 600.

A gas jet inner wall tube 701 coupled to a gas introduction line 615 is attached to an inner wall of the depressurizable process chamber 600. A gas jet nozzle 702 having a jetting direction that faces a center axis of an internal space of the process chamber 600 is provided to the gas jet inner wall tube 701 in a predetermined quantity. The jetting diameter and quantity of the gas jet nozzle 702 are designed so that a predetermined gas jetting flow rate is achieved.

In the present invention, while the gas jetting (blowing) flow rate from the gas jet nozzle 702 is determined in advance during suitable designing so that an agitation action or turbulence action does not occur inside the process chamber by the jetting of the gas to the extent possible, an optimum value is preferably more precisely determined in a gas jetting preliminary experiment. The extent of the agitation action or turbulence action by the gas jetting depends also on the gas exhaust rate and, in the present invention, is preferably 0.1 to 5.0 m/sec, more preferably 0.5 to 3.0 m/sec, and optimally around 2.0 m/sec. For example, in a case where the jet nozzle 702 having a diameter of 2 mm is provided on a semi-circular periphery in a quantity of 20 as illustrated, the $N_2$ gas is preferably introduced at a rate of 200 cc/min inside the process chamber 600. The rate of the $N_2$ gas at this time is 2.0 m/sec. In the present invention, the processing solution is preferably sufficiently degassed in advance to increase an absorbance of the gas. Furthermore, the processing solution supply line used is preferably a resin multilayer tube (made by Nichias Corporation) that suppresses oxygen permeability. While the above has described, an illustrative scenario of the present invention using $N_2$ gas or surrounding gas as the atmospheric gas, $CO_2$ gas can increase the dissolution rate into the processing solution if used and therefore is preferred in place of these gases.

Figure 9:
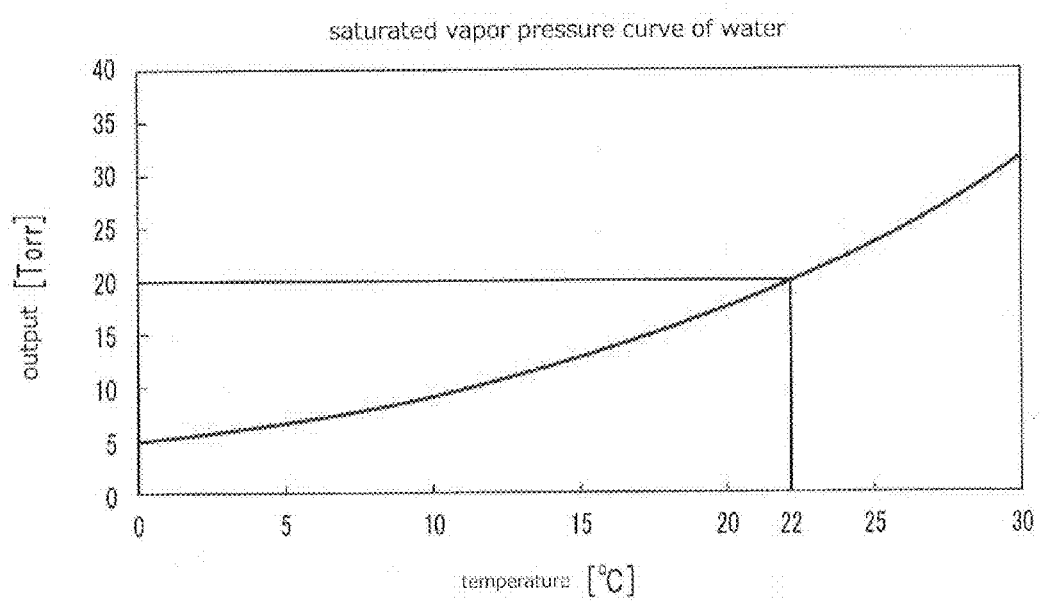
FIG. 9 is a graph showing a saturated vapor pressure curve of water.

FIG. 9 is a graph showing a saturated vapor pressure curve of water. The horizontal axis shows the temperature (° C.) and the vertical axis shows the pressure (Torr). In the present invention, while the process chamber interior is depressurized and then the processing solution is introduced, the degree of the depressurization preferably has an upper limit of 30 Torr to avoid the boiling of the processing solution. If processing solution is supplied onto the treated substrate surface under reduced pressure and then pressurization is performed, the volume of the air bubbles, if they remain inside the hole, is further reduced by the pressurization, making the air bubbles more readily removable from the hole, and thus such a method is preferred. For example, when the interior is pressurized from a depressurized state of 30 to 760 Torr, the volume of the air bubbles becomes approximately 1/25. Accordingly, in the present invention, the preferred mode is to perform depressurization, sufficiently supply the processing solution, and subsequently perform pressurization. Furthermore, this depressurization and pressurization may repeatedly occur. In the present invention, processing is made usually under a normal pressure, further effect is enhanced when performed under reduced pressure as described above. Hence, the inventors prepared a depressurizable process chamber and tried to verify the above under reduced pressure (30 Torr). As a result, etching was completed at a percentage of 100% for both the hydrofluoric acid solution (HF: 1 to 20%) and the buffered hydrofluoric acid solution (ammonium fluoride: 20%, HF: 1 to 20%). While the effect of this depressurization depends on the degree of depressurization to a certain extent, the boiling point of the processing solution is exceeded when depressurization is excessive. Depressurization performed in a range in which the boiling point is not exceeded thus offers more convenience in terms of device design, and is therefore preferred.

In the present invention, for the purpose of performing the processing of the micro vacancy more reliable and more efficient, use of a processing solution was improved wettability with respect to SiO2, for example, surfactant additives BHF is preferred. Or, it is also preferable to combine a CO2 atmosphere for the same purpose.

EXAMPLE

Two 5 inch SOI substrates were prepared. 500 holes (micro vacancies) sized within numerical ranges described in the description of the present invention but being different in size such as depth were formed in a Si layer on the surface of the respective substrates (sample A, B) using the etching process which is generally carried out in the semiconductor field. The hole-pattern and the respective hole-sizes were devised so as to be the same between the samples A and B. The samples A and B were processed using the apparatus of FIG. 7 as follows. The sample A was processed while rotated at 400 rpm and received 5 ppm concentration ozone water to be supplied at the center thereof for one minute at a flow rate of 1 L/min. Subsequently, the sample wafer was rotated at 1200 rpm for one minute so as to be dried (pre-process). Next, the sample subjected to the pre-processing as described above was processed while rotated at 400 rpm and received BHF to be supplied at the center thereof at a flow rate of 1 L/min for five minutes. Next, it was subjected to rinse-processing while rotated at 400 rpm and received ultrapure water at the center thereof at a flow rate of 2 L/min for five minutes. Subsequently, the sample A was rotated at 1200 rpm for one minute so as to be dried (etching process). Sample B was processed in the similar process as that of the sample A except the above pre-process. After completion of the above steps, defects in the etching of the sample holes (micro vacancies) were evaluated. In the sample A subjected to the etching process after the pre-process, number of etching defects was 0 in 500 holes. In the sample B subjected to the etching process without the pre-process, number of etching defects reached 85 in 500 holes.

While the above has described the present invention specifically, the technology of the present invention is not limited to TSV and is also applicable to other technological fields such as microelectromechanical systems (MEMS), for example, as long as the technology requires a high-aspect ratio hole.

REFERENCE SIGNS LIST

100 SOI substrate
101 Silicon (Si) semiconductor substrate
102 Silicon oxide ($SiO_2$) layer
103 Si layer (103-1, 103-2)
104 Hole 105 Air bubble
106 Processing solution
107 Gas-liquid interface
108 Inside wall surface (108-1, 108-2)
109 Inner bottom wall surface
110 Opening
200 Processing system
201 Depressurization process chamber
202 Treated body placement table
202-1 Rotating shaft for treated body placement table
203 Treated body
204 Atmospheric gas supply line
204a micro vacancy
205 Processing (chemical) solution supply line
206 Recovery hood
207 Depressurization waste solution tank
208 Air or $N_2$ supply line
209 Drainage line
210 Recovery line
211, 212 Exhaust line
213 Exhaust pump
214, 215, 216, 217, 218, 219, 220, 221 Valve
222 Variable supply rate nozzle for processing solution
301 Spinner
302 Cartridge
303 Aluminum frame
400 Nitrogen force-feed type processing (chemical) solution supply system
401 Canister
402 Processing solution supply line
403, 411 Stop valve
404 Flow rate adjustment valve
405 Flow meter
406 Mist trap
407, 408 Nitrogen gas supply line
409 Vent (exhaust) valve
410 Flow-dividing joint
412 Regulator
413 Joint
414, 415 Quick connector
501 Drain flange
502 Depressurization flange
503 Waste solution introduction flange
504 Gas introduction flange
505 Vacuum gauge
506 Flow meter
507 Solution level observation window
600 Depressurization process chamber
601 Chamber construct
602 Upper lid
603 Treated body placement stage
604 Rotating shaft
605 Magnetic fluid seal
606 Special processing (chemical) solution supply line
607 Ozonized water supply line
608 Ultrapure water supply line
609, 610, 611, 618 Flow meter
612, 613, 614, 617, 621, 624 Valve
615 Gas introduction line
619 Gas discharge line
616, 620, 623 Flange
622 Waste solution line
625 Observation window (625-1, 625-2)
626 Vacuum gauge
701 Gas jet inner wall tube
702 Gas jet nozzle

The invention claimed is:

1. A method for processing an inner wall surface of a micro vacancy, comprising:
arranging a substrate in a processing space, the substrate comprising a silicon oxide layer and a silicon layer on the silicon oxide layer, the silicon layer comprising a surface on which a processing solution is to be applied and a micro vacancy with an opening on the surface, the micro vacancy passing through the silicon layer and comprising an exposed surface of the silicon oxide layer at a bottom portion thereof, an aspect ratio (l/r) of a micro vacancy depth (l) to an opening diameter (r) of the micro vacancy being at least 5, or the aspect ratio being less than 5 and a ratio (V/S) of a micro vacancy volume (V) to a surface area of the opening (S) being at least 3;
exposing the micro vacancy to an atmosphere through the opening in the processing space so as to form, on the inner wall surface of the micro vacancy, a silicon oxide film thinner than the silicon oxide layer;
introducing a processing solution with a wettability with respect to silicon oxide into the micro vacancy with the silicon oxide film formed on the inner wall surface so as to process the inner wall surface; and
removing the silicon oxide film completely from the inner wall surface of the micro vacancy, wherein
the process of introducing a processing solution with a wettability with respect to silicon oxide comprises causing the processing solution to penetrate to the surface of the silicon oxide layer at the bottom portion, and
the processing solution cleans the surface of the silicon oxide layer at the bottom portion or etches the silicon oxide layer at the bottom portion.

2. The method according to claim 1, further comprising using the micro vacancy for forming a Through Silicon Via (TSV).

3. The method according to claim 2, wherein the aspect ratio is less than 5 and a ratio (V/S) of a micro vacancy volume (V) to a surface area of the opening (S) is at least 3.

4. A method for producing a device comprising:
preparing a substrate comprising a silicon oxide layer and a silicon layer on the silicon oxide layer, the substrate comprising a micro vacancy passing through the silicon layer, and the silicon oxide layer being exposed to a space of the micro vacancy at a bottom portion of the micro vacancy;
forming, on an inner wall surface of the micro vacancy, a silicon oxide film thinner than the silicon oxide layer by oxidizing the silicon layer so that the silicon oxide layer is exposed to the space at the bottom portion of the micro vacancy with the silicon oxide film;
introducing a processing solution with a wettability with respect to the silicon oxide film into the space of the micro vacancy with the silicon oxide film; and
removing the silicon oxide film after introducing the processing solution.

5. The method according to claim 4, wherein an aspect ratio (l/r) of a micro vacancy depth (l) to an opening diameter (r) of the micro vacancy is at least 5.

6. The method according to claim 4, wherein an aspect ratio (l/r) of a micro vacancy depth (l) to an opening diameter (r) of the micro vacancy is less than 5, and a ratio (V/S) of a micro vacancy volume (V) to a surface area of the opening (S) being at least 3.

7. The method according to claim 4, wherein the silicon oxide film is formed by oxidizing the silicon layer using ozone water.

8. The method according to claim 4, wherein the silicon oxide film is formed by oxidizing the silicon layer using at least one of hydrochloric acid, nitric acid or sulfuric acid.

9. The method according to claim 4, wherein the processing solution is introduced into the space of the micro vacancy under a reduced pressure atmosphere.

10. The method according to claim 4, wherein the processing solution is an etching solution used for etching the silicon oxide layer.

11. The method according to claim 4, wherein the processing solution is buffered hydrofluoric acid.

12. The method according to claim 4, wherein the processing solution is a cleaning solution used for cleaning the micro vacancy.

13. The method according to claim 4, wherein the substrate includes a semiconductor substrate, and the silicon oxide layer is arranged between the semiconductor substrate and the silicon layer.

14. The method according to claim 4, wherein the micro vacancy is used for forming a Through Silicon Via (TSV).

15. A method for producing a device comprising:
preparing a substrate comprising a silicon oxide layer and a silicon layer on the silicon oxide layer, the substrate comprising a micro vacancy passing through the silicon layer, and the silicon oxide layer being exposed to a space of the micro vacancy at a bottom portion of the micro vacancy;
forming, on an inner wall surface of the micro vacancy, a silicon oxide film thinner than the silicon oxide layer by oxidizing the silicon layer so that the silicon oxide layer is exposed to the space at the bottom portion of the micro vacancy with the silicon oxide film;
introducing a processing solution with a wettability with respect to the silicon oxide film into the space of the micro vacancy with the silicon oxide film; and
completely removing the silicon oxide film from the inner wall surface of the micro vacancy.

16. The method according to claim 4, wherein the processing solution contacts the silicon oxide layer at the bottom portion of the micro vacancy with the silicon oxide film.

17. The method according to claim 4, wherein a thickness of the silicon oxide film is several nanometers.

18. The method according to claim 4, wherein an inner wall surface of the micro vacancy is a curved surface.

19. The method according to claim 7, wherein the ozone water is supplied on the substrate with rotating the substrate.

20. The method according to claim 4, further comprising forming a Through Silicon Via in the micro vacancy, wherein
the substrate includes a semiconductor substrate, and the silicon oxide layer is arranged between the semiconductor substrate and the silicon layer,
the silicon oxide film is formed by oxidizing the silicon layer using ozone water,
the ozone water is supplied on the substrate with rotating the substrate,
the processing solution is buffered hydrofluoric acid, the processing solution is introduced into the space of the micro vacancy under a reduced pressure atmosphere, and
the processing solution etches the silicon oxide layer.

* * * * *